(12) United States Patent
Wang et al.

(10) Patent No.: US 10,355,669 B2
(45) Date of Patent: Jul. 16, 2019

(54) FILTERING SYSTEM AND AN ASSOCIATED METHOD THEREOF

(71) Applicant: General Electric Company, Schenectady, NY (US)

(72) Inventors: Ruxi Wang, Cohoes, NY (US); Satish Prabhakaran, Albany, NY (US); Feng Chen, Niskayuna, NY (US); Di Zhang, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 297 days.

(21) Appl. No.: 15/241,434

(22) Filed: Aug. 19, 2016

(65) Prior Publication Data
US 2018/0054184 A1  Feb. 22, 2018

(51) Int. Cl.
| H02M 1/44 | (2007.01) |
| H03H 11/12 | (2006.01) |
| H02M 7/537 | (2006.01) |
| H05K 7/20 | (2006.01) |
| H01L 35/00 | (2006.01) |

(52) U.S. Cl.
CPC .............. H03H 11/12 (2013.01); H01L 35/00 (2013.01); H02M 1/44 (2013.01); H02M 7/537 (2013.01); H05K 7/20009 (2013.01); H05K 7/20218 (2013.01)

(58) Field of Classification Search
CPC ............ H02M 1/44; H02M 7/06; H02M 1/32; H02M 2001/327; H02M 7/5387; H03H 11/12
See application file for complete search history.

(56) References Cited

U.S. PATENT DOCUMENTS 6,636,107 B2 * 10/2003 Pelly ...................... H02M 1/12
                                                      327/552
6,690,230 B2    2/2004 Pelly
(Continued)

FOREIGN PATENT DOCUMENTS

EP              1 143 602 A2    10/2001

OTHER PUBLICATIONS

Takahashi et al., "Active EMI filter for switching noise of high frequency inverters", Power Conversion Conference—Nagaoka 1997., Proceedings of the, vol. 1, pp. 331-334, Aug. 3-6, 1997, Nagaoka.
(Continued)

Primary Examiner — Jue Zhang
Assistant Examiner — Lorena D Bruner
(74) Attorney, Agent, or Firm — Joseph J. Christian (57) ABSTRACT

A filtering unit is presented. The filtering unit includes at least two operational amplifiers, where each of the at least two operational amplifiers includes an input end and an output end, where the input end of one operational amplifier is coupled across the corresponding input end of another operational amplifier of the at least two operational amplifiers. The filtering unit also includes a direct current link operatively coupled to the at least two operational amplifiers and at least one thermoelectric module, where each thermoelectric module includes a conducting layer, where the direct current link and at least one of the at least two operational amplifiers are operatively coupled to the at least one thermoelectric module. A filtering system is also presented.

23 Claims, 9 Drawing Sheets

(56) References Cited

U.S. PATENT DOCUMENTS

| | | |
|---|---|---|
| 6,775,157 B2 | 8/2004 | Honda |
| 6,781,444 B2 | 8/2004 | Pelly |
| 6,839,250 B2 | 1/2005 | Takahashi et al. |
| 6,842,069 B2 | 1/2005 | Takahashi et al. |
| 7,405,528 B2 | 7/2008 | Ho et al. |
| 7,545,656 B2 | 6/2009 | Lanni |
| 9,048,756 B2 | 6/2015 | Dong et al. |
| 2015/0171750 A1* | 6/2015 | Zeng .............. H02M 1/08 323/311 |
| 2015/0207411 A1 | 7/2015 | Calhoun et al. |
| 2015/0280099 A1* | 10/2015 | Boukai .............. H01L 35/32 136/203 |
| 2015/0349625 A1 | 12/2015 | Hyoung et al. |
| 2017/0194860 A1* | 7/2017 | Oak .............. H02M 3/158 |

OTHER PUBLICATIONS

Son et al., "A new active common-mode EMI filter for PWM inverter", IEEE Transactions on Power Electronics, vol. 18, Issue: 6, pp. 1309-1314, Nov. 2003.

Chen et al., "An active EMI filtering technique for improving passive filter low-frequency performance", IEEE Transactions on Electromagnetic Compatibility, vol. 48, Issue: 1, pp. 172-177, Feb. 2006.

Chen et al., "An Experimental Study of Common- and Differential-Mode Active EMI Filter Compensation Characteristics", IEEE Transactions on Electromagnetic Compatibility, vol. 51, Issue: 3, pp. 683-691, Aug. 2009.

Robutel et al., "Design of High Temperature EMI Input Filter for a 2 kW HVDC-Fed Inverter", Engineering Sciences [physics] / Electric power, Papers: 000236, May 2010, 8 Pages, Albuquerque, United States.

N Boonpirom, "The EMI improvement on active filter using common-mode noise circuits balanced method", Electrical Machines and Systems (ICEMS), 2015 18th International Conference on, pp. 1325-1328, Oct. 25-28, 2015, Pattaya.

Esmaelii, A., "A Novel Active Filter for Mitigation of EMI and Other Adverse Effects of PWM Inverter-Fed AC Motor," Amirkabir International Journal of Electrical & Electronics Engineering, vol. 41, No. 1, pp. 45-53 (2009).

Sabeer, J.K., "Thermoelectric Generators(TEG)," pp. 1-36 (Feb. 25, 2015).

Zhang, X., et al., "EMI filter design and optimization for both AC and DC side in a DC-fed motor drive system," Applied Power Electronics Conference and Exposition (APEC), pp. 597-603 (2013) (Abstract).

Extended European Search Report and Opinion issued in connection with corresponding EP Application No. 17186178.4 dated Nov. 10, 2017.

* cited by examiner

FILTERING SYSTEM AND AN ASSOCIATED METHOD THEREOF

BACKGROUND

Embodiments of the present invention relate generally to a filtering system, and more specifically to a self-powered active electromagnetic interference (EMI) filter for a pulse width modulated (PWM) inverter.

Typically, a PWM inverter is employed in motor drive units used in applications such as aviation systems, submarines, oil and gas extraction systems, and the like. In the PWM inverter, the switches are continuously activated and deactivated according to a predetermined pattern. A fast change in voltage and current of the PWM inverter occurs due to continuous activation and deactivation of the switches of the PWM inverter. As a result, high frequency harmonic components are generated due to the fast change in voltage and current. The generation of the high frequency harmonic components leads to motor failure and electromagnetic interferences. In addition, common mode noise is generated at both alternating current (AC) side and direct current (DC) side of the PWM inverter.

Typically, passive filters are employed in order to filter the common mode noise generated in the PWM inverter. However, such passive filters are costly and add considerable weight and size to the PWM inverter due to the use of inductors and capacitors. For aviation applications, it is desirable to use devices/filters having considerably lower weight.

Currently, in some applications, for example, aviation applications, an active EMI filter is employed for filtering the common mode noise of the PWM inverter. Such active EMI filters have a comparably lower weight, are compact, and provide a higher power density as compared to passive filters. However, the active EMI filter employs an external power supply source for powering the components. The use of external power supply source for the active EMI filter creates an additional electrical loop through which noise signals may be introduced. Further, the use of the external power supply source establishes a need for a grounding path. Such a grounding path may allow for generated signals to leak, thereby compromising the filtering capability of the active EMI filter. Moreover, the conventional active EMI filters are used to reduce the common mode noise of only one side of the PWM inverter, i.e. either the AC side or the DC side. The reduction of noise at only one side causes common mode noise at the other side of the PWM inverter to increase considerably.

BRIEF DESCRIPTION

In accordance with one embodiment of the present invention, a filtering unit is disclosed. The filtering unit includes at least two operational amplifiers, where each of the at least two operational amplifiers comprises an input end and an output end, where the input end of one operational amplifier is coupled across the corresponding input end of another operational amplifier of the at least two operational amplifiers. The filtering unit also includes a direct current link operatively coupled to the at least two operational amplifiers and at least one thermoelectric module, where each thermoelectric module comprises a conducting layer, where the direct current link and at least one of the at least two operational amplifiers are operatively coupled to the at least one thermoelectric module.

In accordance with another embodiment of the present invention, a filtering system is disclosed. The filtering system includes an inverter including a first side, a second side, and a plurality of switching units; and a filtering unit coupled to the first side and the second side of the inverter, the plurality of switching units, or a combination thereof, where the filtering unit includes at least two operational amplifiers, where each of the at least two operational amplifiers comprises an input end and an output end, where the input end of one operational amplifier is coupled across the corresponding input end of another operational amplifier of the at least two operational amplifiers. The filtering unit further includes a direct current link operatively coupled to the at least two operational amplifiers and at least one thermoelectric module, where each thermoelectric module comprises a conducting layer; where the direct current link and at least one of the at least two operational amplifiers are operatively coupled to the at least one thermoelectric module.

DRAWINGS

These and other features, aspects, and advantages of the present specification will become better understood when the following detailed description is read with reference to the accompanying drawings in which like characters represent like parts throughout the drawings, wherein.

DETAILED DESCRIPTION

Unless defined otherwise, technical and scientific terms used herein have the same meaning as is commonly understood by one of ordinary skill in the art to which this specification belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean one, some, or all of the listed items. The use of "including," "comprising" or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. Furthermore, terms "circuit" and "circuitry" and "controlling unit" may include either a single component or a plurality of components, which are either active and/or passive and are connected or otherwise coupled together to provide the described function. In addition, the term operatively coupled as used herein includes wired coupling, wireless coupling, electrical coupling, magnetic coupling, radio communication, software based communication, or combinations thereof.

As will be described in detail hereinafter, various embodiments of an exemplary filtering system and an exemplary method of operating the filtering system are disclosed. Specifically, embodiments of a self-powered active electromagnetic interference (EMI) filter for reducing common mode noise levels in inverters are disclosed. The exemplary filtering system may be used in electrical systems employed in applications such as aircrafts, submarines, oil and gas extraction systems, and the like. The use of a thermoelectric module for powering the active EMI filter eliminates the need of a separate power supply that would otherwise be required for conventional active EMI filters. Also, self-powering of the active EMI filter employing the thermoelectric module aids in providing a floating filtering system. In accordance with embodiments of the present invention, the floating filtering system provides an improved common mode noise filtering performance.

Figure 1:
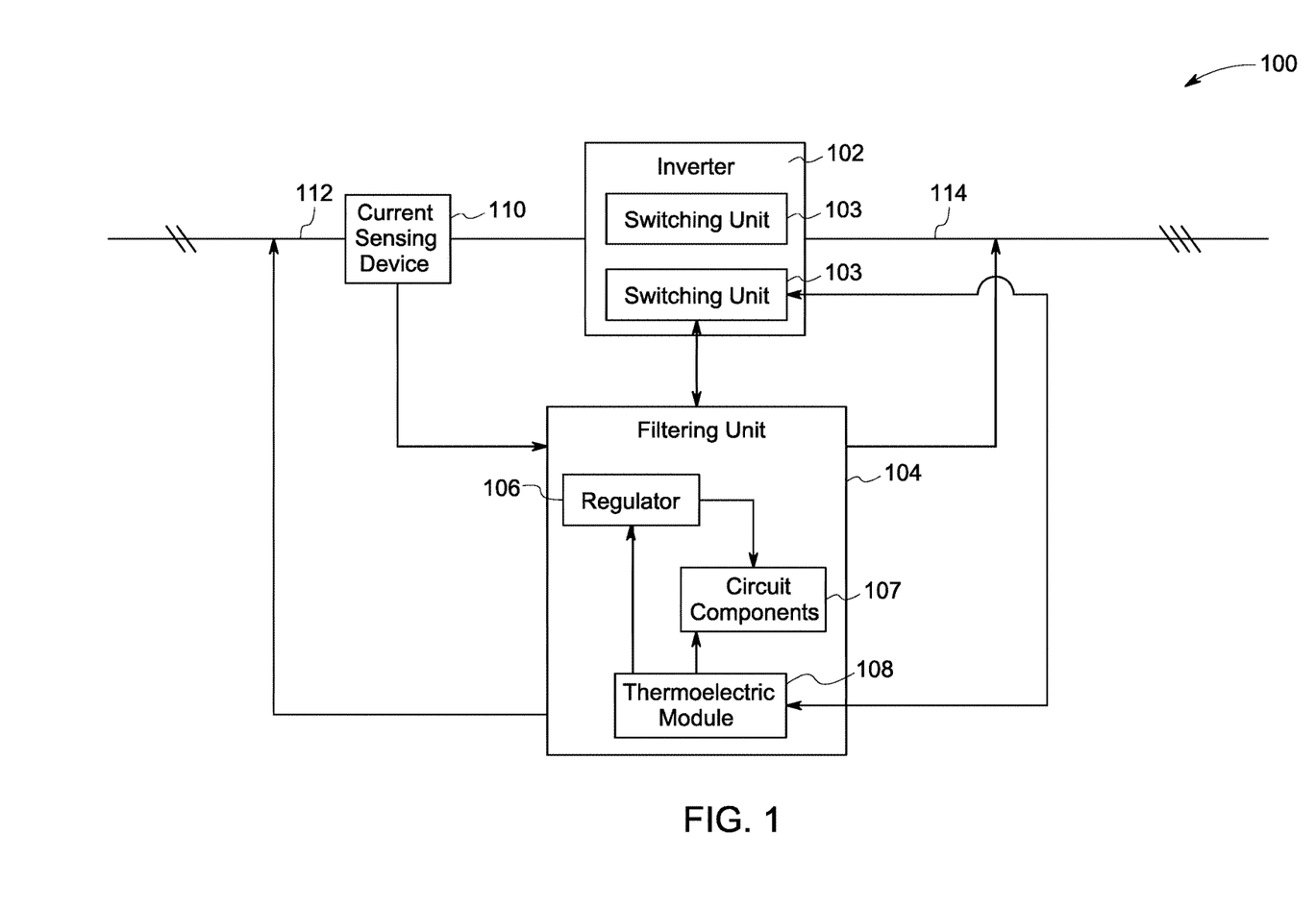
FIG. 1 is a block diagram of an exemplary active electromagnetic interference (EMI) filtering system in accordance with certain embodiments of the present invention.

Turning now to the drawings and by way of example in FIG. 1, a block diagram of an exemplary active electromagnetic interference (EMI) filtering system 100 in accordance with certain embodiments of the present invention is shown. The filtering system 100 includes an inverter 102, a filtering unit 104, and a current sensing device 110. In one embodiment, the inverter 102 includes a pulse width modulated (PWM) inverter. In the illustrated embodiment, the inverter 102 includes a plurality of switching units 103. In one embodiment, each switching unit includes a single switch. In such an embodiment, the single switch may be a semiconductor switch. In another embodiment, each switching unit may be a power semiconductor module having a plurality of switches. In such an embodiment, each of the plurality of switches may be a semiconductor switch. In one embodiment, the semiconductor switch includes an insulated gate bipolar transistor, a metal oxide semiconductor field effect transistor, a field-effect transistor, an injection enhanced gate transistor, an integrated gate commutated thyristor, or the like. In another embodiment, the semiconductor switch includes a gallium nitride based switch, a silicon carbide based switch, a gallium arsenide based switch, or the like.

The inverter 102 includes a first side 112 and a second side 114. In one embodiment, the first side 112 is a direct current (DC) side and the second side 114 is an alternating current (AC) side. In such an embodiment, the DC side is the input side and the AC side is the output side. In another embodiment, the first side 112 is an AC side and the second side 114 is a DC side. In such an embodiment, the AC side is the input side and the DC side is the output side. In accordance with the embodiments discussed herein, the reference numeral 112 may be used for referring to the DC side or the first side and the reference numeral 114 may be used for referring to the AC side or the second side.

The filtering unit 104 is operatively coupled to the inverter 102. Specifically, the filtering unit 104 is operatively coupled to the plurality of switching units 103. The filtering unit 104 includes a regulator 106, a plurality of circuit components 107, and a thermoelectric module 108. In one embodiment, the regulator 106 is a voltage regulator. In one embodiment, the voltage regulator includes a silicon regulator having a ceramic packaging. In one specific embodiment, the voltage regulator may include a silicon-on-insulator (SOI) regulator. The plurality of circuit components 107 include a plurality of operational amplifiers (op-amps), a DC link, a plurality of resistors, and a plurality of capacitors operatively coupled to each other. In one embodiment, the plurality of op-amps may include SOI based op-amps.

The thermoelectric module 108 is operatively coupled to the plurality of circuit components 107 and the regulator 106 and is configured to supply power to the plurality of circuit components 107 and the regulator 106. Further, the thermoelectric module 108 is configured to generate a voltage due to a temperature difference between two substrates of the thermoelectric module 108. Hence, the plurality of circuit components 107 and the regulator 106 are self-powered and need for any additional power supply is avoided.

In one embodiment, the thermoelectric module 108 is rated to operate at a temperature of 200 degrees centigrade, for example. In another embodiment, the thermoelectric module 108 may be rated to operate at a temperature greater than 200 degrees centigrade. In one embodiment, the plurality of circuit components 107 and the regulator 106 are disposed on the thermoelectric module 108. In one specific embodiment, each of the plurality of switching units 103 is operatively coupled to the thermoelectric module 108.

The current sensing device 110 is configured to sense a current flowing into the first side 112 of the inverter 102. An electrical parameter is generated by the filtering unit 104 based on the sensed current signal by the filtering unit 104. The "electrical parameter" may include power, current, or voltage. For example, in one embodiment, the electrical parameter includes a reverse polarity current signal. In one specific embodiment, the reverse polarity current signal may be phase shifted by 180 degrees from the sensed current signal. The reverse polarity current signal is transmitted to at least one of the first and second sides 112, 114 of the inverter 102 to reduce a common mode noise level of the first and second sides 112, 114 of the inverter 102. In one embodiment, the current sensing device 110 may be integrated to the filtering unit 104.

Figure 2:
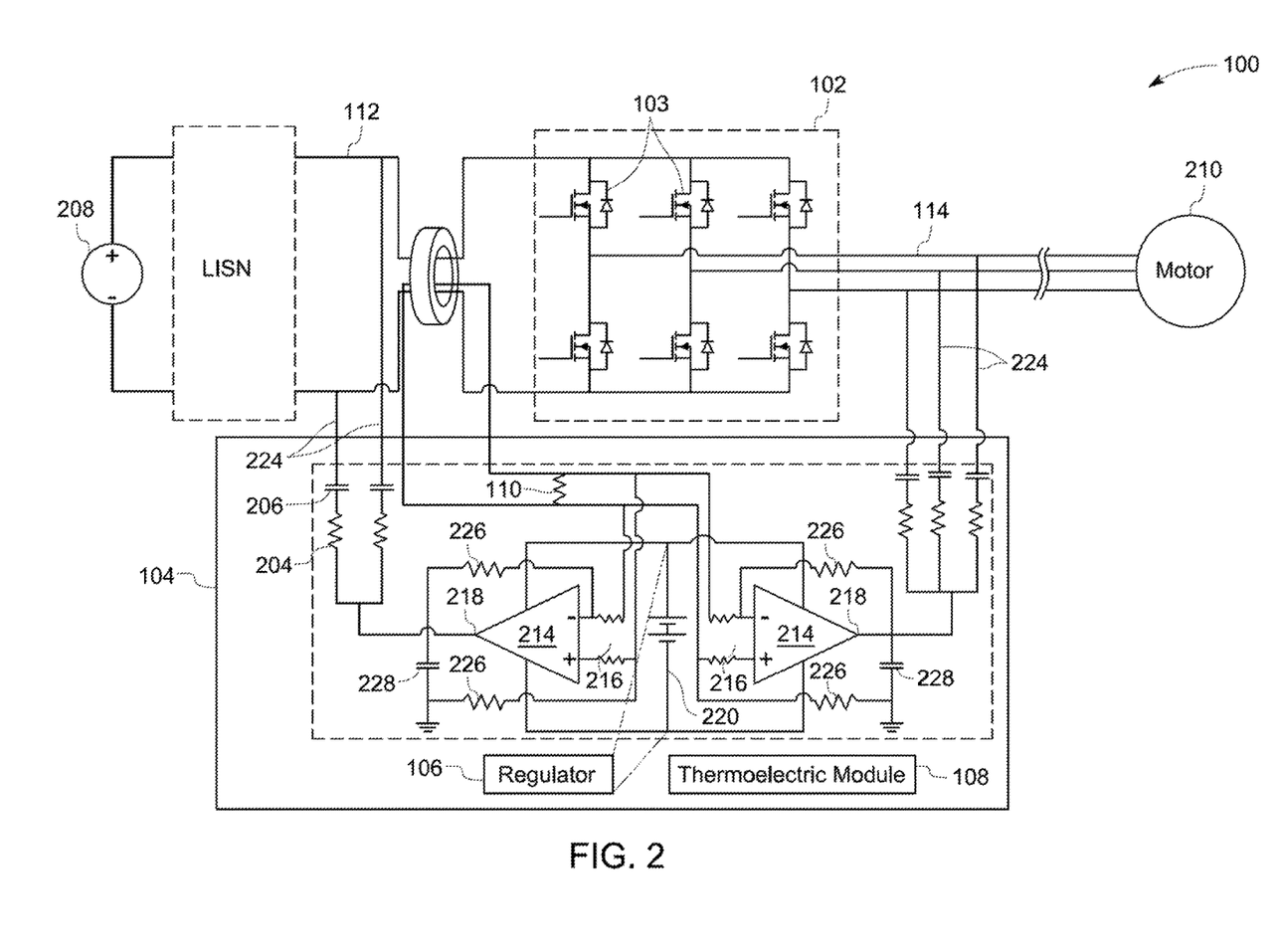
FIG. 2 is a diagrammatical representation of one embodiment of the active electromagnetic interference filtering system of FIG. 1.

Referring now to FIG. 2, a diagrammatical representation of one embodiment of the filtering system 100 of FIG. 1 is shown. The DC side 112 of the inverter 102 is coupled to a power source 208. The AC side 114 of the inverter 102 is coupled to a load such as a motor 210. In one embodiment, the load may include a three phase resistive and inductive load. In other embodiments, the load may include any other device that consumes electric power. The load may be employed in aviation systems, submarines, oil and gas extraction systems, and the like.

As discussed previously, the filtering unit 104 includes the plurality of circuit components 107, the thermoelectric module 108, and the regulator 106. The plurality of circuit components 107 include two operational amplifiers (op-amps) 214, a direct current (DC) link 220, and passive components such as resistors 226 and capacitors 228. The op-amps 214 are operatively coupled to the DC link 220. Each of the two op-amps 214 includes an input end 216 and an output end 218. The input ends 216 of the op-amps 214 are coupled across each other. The current sensed by the current sensing device 110 flows into the input ends 216 of the op-amps 214.

The thermoelectric module 108 is configured to provide power to the two op-amps 214 and the regulator 106. The regulator 106 is configured to regulate the varying value of voltage generated by the thermoelectric module 108 to a fixed value of voltage. The fixed value voltage is transmitted to the op-amps 214 via the DC link 220 to power the op-amps 214. The op-amps 214 are configured to perform the desired functions, such as aiding filtering of common mode noise of the inverter 102. The structure and mode of operation of one embodiment of the thermoelectric module 108 is explained in detail with respect to FIG. 3(a). In operation, the reverse polarity current signal described above may be generated at the output ends 218 of the op-amps 214 due to the powering of the op-amps 214. The reverse polarity current signal is then transmitted to the first side 112 and the second side 114 of the inverter 102 to reduce the common mode noise of the inverter 102.

The reverse polarity current signal is transmitted from the output ends 218 of the op-amps 214 to the first and second sides 112, 114 of the inverter 102 via a plurality of transmission branches 224. Each transmission branch 224 includes a resistor 204 and a capacitor 206 coupled in series. When the reverse polarity current signal is transmitted to the inverter 102, transmission of common mode noise from the inverter 102 to the motor 210 and the power source 208 is considerably reduced.

Figure 3A:
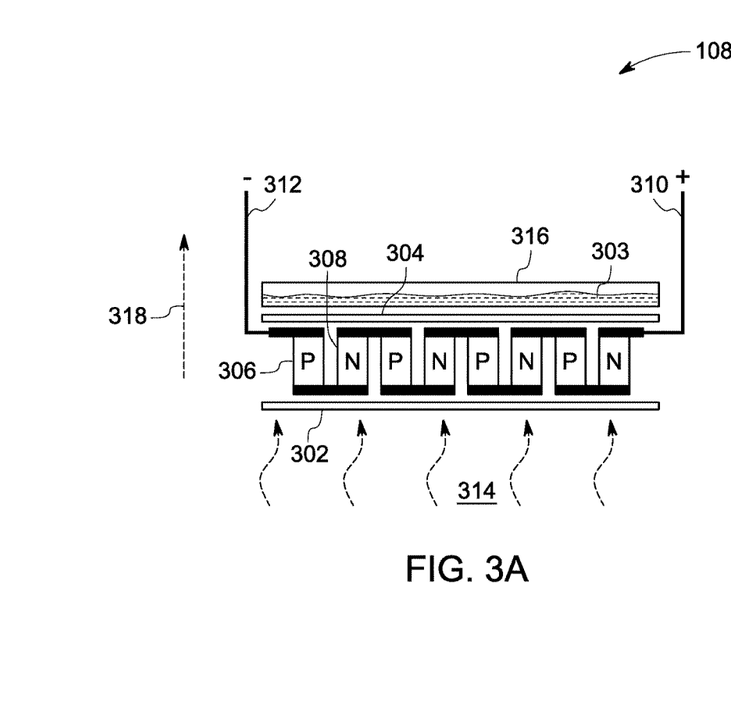
FIGS. 3(a)-3(b) are diagrammatical representations of one embodiment of a thermoelectric module.
Figure 3B:
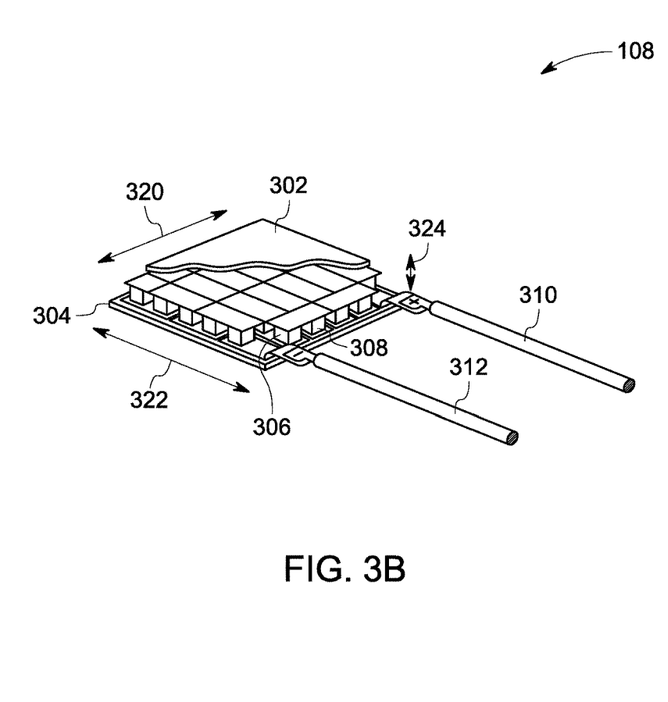

FIGS. 3(a)-3(b) are diagrammatical representations of one embodiment of the thermoelectric module 108 for use in the system of FIG. 1. In particular, FIG. 3(a) is a diagrammatical representation of one embodiment of the thermoelectric module 108.

The thermoelectric module 108 includes a first substrate 302 and a second substrate 304. The first substrate 302 is disposed apart from the second substrate 304. The first substrate 302 and the second substrate 304 includes an electrically insulated material. In particular, the first substrate 302 and the second substrate 304 may be made of a material having high thermal conductivity. In one embodiment, each of the first substrate 302 and the second substrate 304 include a ceramic plate. The ceramic plate includes a graphite coated ceramic plate.

Furthermore, the thermoelectric module 108 includes a plurality of combinations of a P-type element 306 and an N-type element 308 coupled in series to each other. The P-type element 306 is a positively charged semiconductor or p-doped semiconductor. The N-type element 308 is a negatively charged semiconductor or n-doped semiconductor. The combinations of the P-type elements 306 and the N-type elements 308 are disposed between the first substrate 302 and the second substrate 304. Further, the plurality of the combinations of the P-type elements 306 and the N-type elements 308 include a first terminal 310 and a second terminal 312. In one embodiment, the first terminal 310 is a positive terminal and the second terminal 312 is a negative terminal. In another embodiment, the second terminal 312 is a positive terminal and the first terminal 310 is a negative terminal.

In the illustrated embodiment, during operation, the first substrate 302 is disposed proximate to a high temperature environment 314. In one example, temperature of the high temperature environment may be about greater than or equal to 200 degrees centigrade. The second substrate 304 is disposed on a cooling device 316. In one embodiment, the cooling device 316 includes an aluminum pipe for allowing flow of a coolant 303. In another embodiment, the cooling device 316 includes a copper pipe. The coolant 303 may be a liquid coolant or gaseous coolant. The liquid coolant may include water, oil, and the like. The gaseous coolant may include hydrogen. Reference numeral 318 is representative of the direction of heat flow.

It may be noted herein that thermoelectric principle involves a direct conversion of temperature differences to electric voltage and vice versa. Accordingly, the thermoelectric module 108 generates a voltage when there is a difference in temperature between the two substrates 302, 304 of the thermoelectric module 108. In the illustrated embodiment, such a voltage is generated between the first and second terminals 310, 312.

FIG. 3(b) is another diagrammatical representation of the thermoelectric module 108 of FIG. 3(a). In particular, FIG. 3(b) represents a top view of the thermoelectric module 108. The thermoelectric module 108 includes the first and second substrates 302, 304. The first and second substrates 302, 304 are disposed apart from each other to accommodate the combinations of the P-type elements 306 and the N-type elements 308. The plurality of the combinations of the P-type elements 306 and the N-type elements 308 are coupled in series with each other and are disposed between the first substrate 302 and the second substrate 304.

As discussed previously, the plurality of the combinations of the P-type elements 306 and the N-type elements 308 include the first terminal 310 and the second terminal 312. Side lengths of the first and second substrates 302, 304 are represented by reference numerals 320, 322. Furthermore, the distance between the first and second substrates 302, 304 is represented by the reference numeral 324. In one embodiment, the side lengths 320 and 322 are 30 millimeters (mm) and the distance 324 is 5 mm.

Figure 3C:
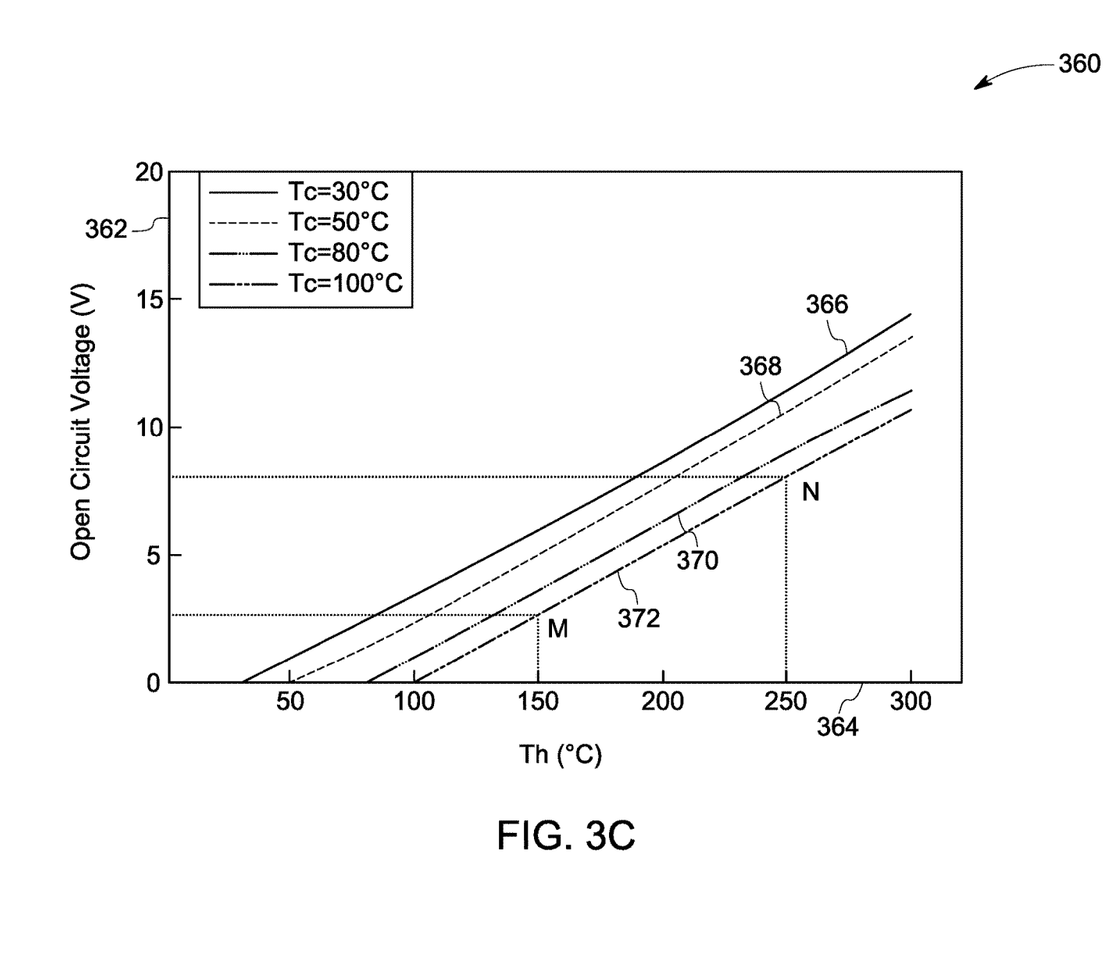
FIG. 3(c) is a graphical representation of temperature versus voltage characteristics of a thermoelectric module in accordance with one embodiment of the invention.

FIG. 3(c) is a graphical representation of temperature versus voltage characteristics 360 of the thermoelectric module 108 of FIG. 3(a) in accordance with one embodiment. Y-axis 362 is representative of an open circuit voltage in volts (V). Further, x-axis 364 is representative of temperature of the high temperature environment 314.

Further, reference numeral 366 represents a curve when temperature of the cooling device 316 is 30° C. The reference numeral 368 represents the curve when temperature of the cooling device 316 is 50° C. The reference numeral 370 represents the curve when temperature of the cooling device 316 is 80° C. Furthermore, the reference numeral 372 represents the curve when temperature of the cooling device 316 is 100° C.

At point 'M' on the curve 372, the temperature of the high temperature environment 314 is 150° C. and the temperature of the cooling device 316 is 100° C. The corresponding open circuit voltage obtained from the thermoelectric module 108 is 2.5 volts approximately. Furthermore, at point N on the curve 372, the temperature of the high temperature environment 314 is 250° C. and the temperature of the cooling device 316 is 100° C. The corresponding open circuit voltage obtained from the thermoelectric module 108 is 8 volts approximately. When the temperature difference between the high temperature environment 314 and cooling device 316 is increased, the open circuit voltage of the thermoelectric module 108 is also increased. In particular, when the temperature difference between the two substrates 302, 304 of the thermoelectric module 108 is increased, the voltage across the first and second terminals 310, 312 of the thermoelectric module 108 is also increased.

Figure 4A:
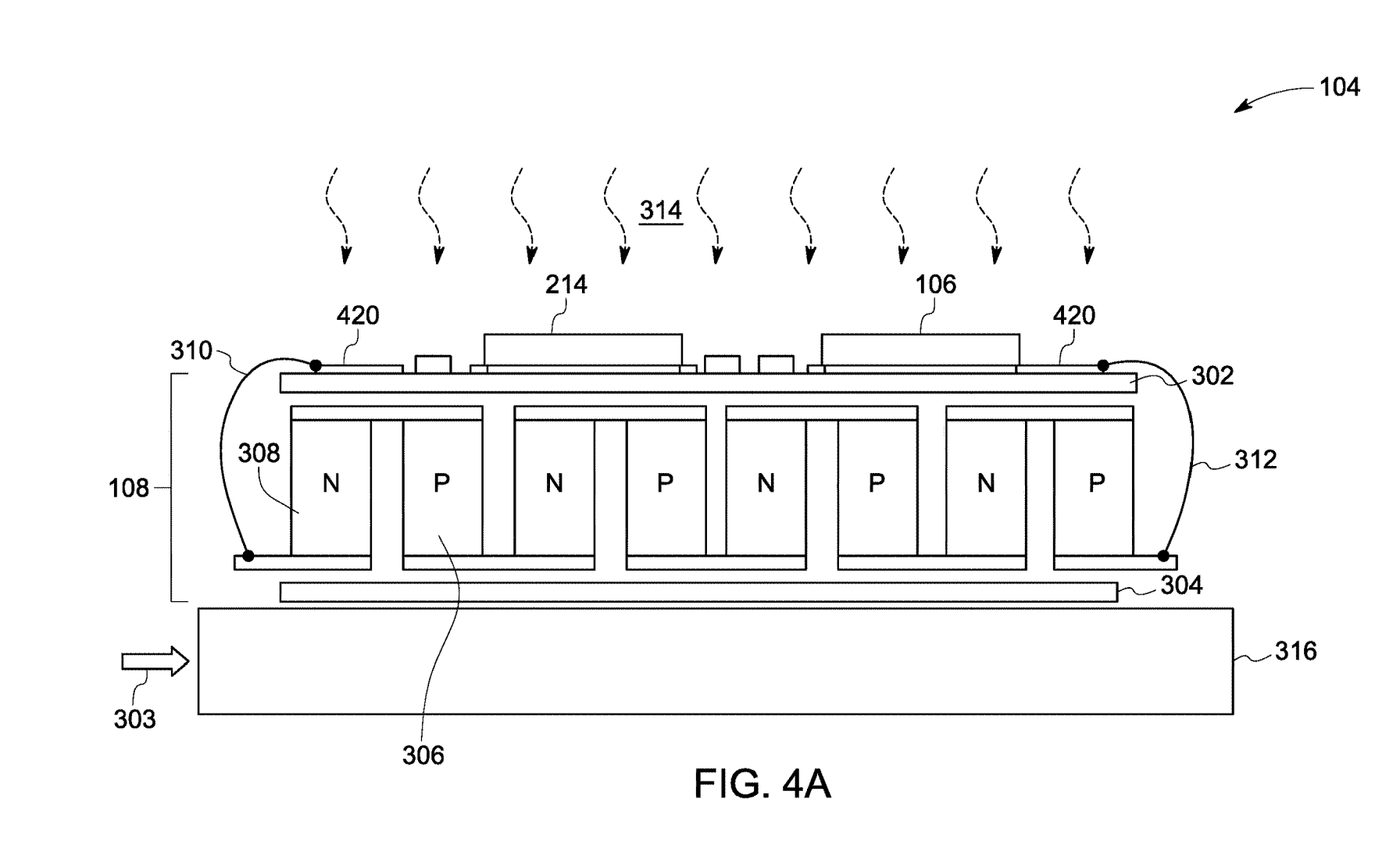
FIG. 4(a) is a diagrammatical representation of a filtering unit in accordance with one embodiment.

FIG. 4(a) is a diagrammatical representation of the filtering unit 104 in accordance with an exemplary embodiment. A conducting layer 420 is disposed on the first substrate 302. In one embodiment, the conducting layer 420 includes an etched pattern of a plurality of conducting paths. In one specific embodiment, the conducting layer 420 includes a dielectric layer or an insulating layer having conducting paths formed therein. In one embodiment, the dielectric or insulating layer may be made of ceramic material. In one particular embodiment, the conducting layer 420 is a direct bonding copper (DBC) sheet. In another embodiment, the conducting layer 420 includes a direct bonding aluminum (DBA) sheet. The op-amps 214 and the regulator 106 are disposed on the conducting layer 420.

The op-amps 214 are SOI op-amps and the regulator 106 is a SOI regulator. The op-amps 214 and the regulator 106 are configured to withstand high temperature (for example, about 200 degrees centigrade). In the illustrated embodiment, the use of the SOI op-amps and the SOI regulator enable the filtering unit 104 to operate effectively at high temperatures. Specifically, each of the SOI op-amps and the SOI regulator includes a layered silicon-insulator-silicon substrate. In one embodiment, the insulator material of the layered silicon-insulator-silicon substrate may include silicon dioxide, sapphire, and the like. Such an insulator enables operation at high temperatures. Further, use of such an insulator is suitable for high-performance radio frequency (RF) and radiation-sensitive applications.

As noted hereinabove, a voltage is generated across the first and second terminals 310, 312 due to a temperature difference between the first substrate 302 and the second substrate 304 of the thermoelectric module 108. The voltage generated across the first and second terminals 310, 312 is a varying voltage. However, the op-amp 214 requires a fixed voltage, for example, 5 volts for efficient operation. Hence, the varying voltage generated from the thermoelectric module 108 needs to be regulated to a fixed voltage. Therefore, the varying voltage generated across the first and second terminals 310, 312 is transmitted to the regulator 106 to generate the fixed voltage. The fixed voltage is transmitted to the op-amps 214 via the DC link 220. Once the fixed value of voltage is transmitted to the op-amps 214, the op-amps 214 are powered to perform the desired function such as aiding in filtering common mode noise of the inverter. Since the thermoelectric module 108 generates the voltage, the filtering unit 104 is self-powered and therefore, need for an external power supply is avoided.

Figure 4B:
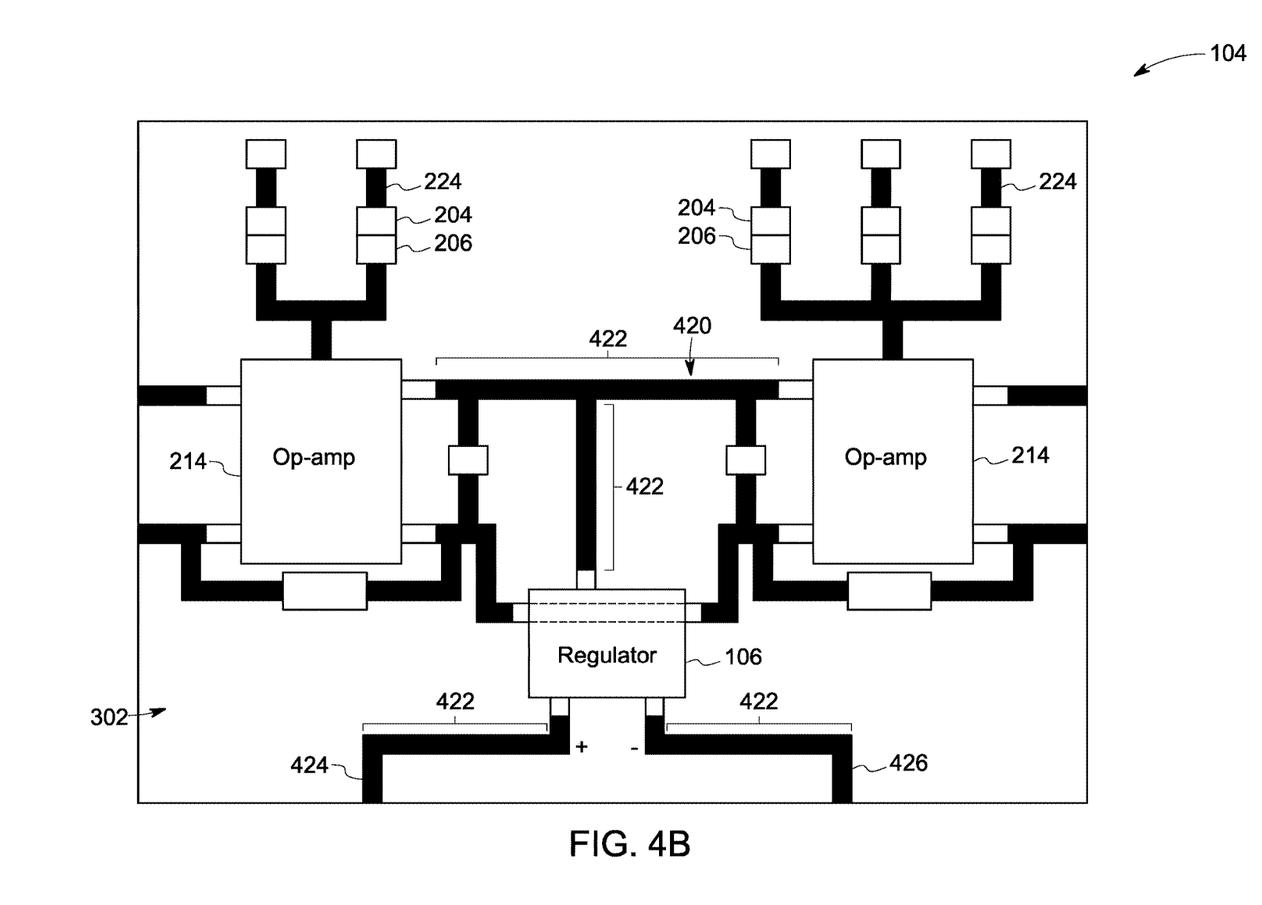
FIG. 4(b) is a top view of a filtering unit in accordance with embodiment of FIG. 4(a)

FIG. 4(b) is a top view of the filtering unit 104 in accordance with embodiment of FIG. 4(a). In the illustrated embodiment, the first substrate 302 includes the conducting layer 420. The conducting layer 420 includes an etched pattern of a plurality of conducting paths 422. The two operational amplifiers 214, the regulator 106, the passive components (not shown), and the transmission branches 224 are disposed on the first substrate 302 and operatively coupled to the plurality of conducting paths 422. The resistor 204 and the capacitor 206 are operatively coupled to the plurality of conducting paths 422. An end 424 of one of the plurality of conducting paths 422 is coupled to the second terminal 312. Additionally, an end 426 on another conducting path 422 is coupled to the first terminal 310.

Figure 4C:
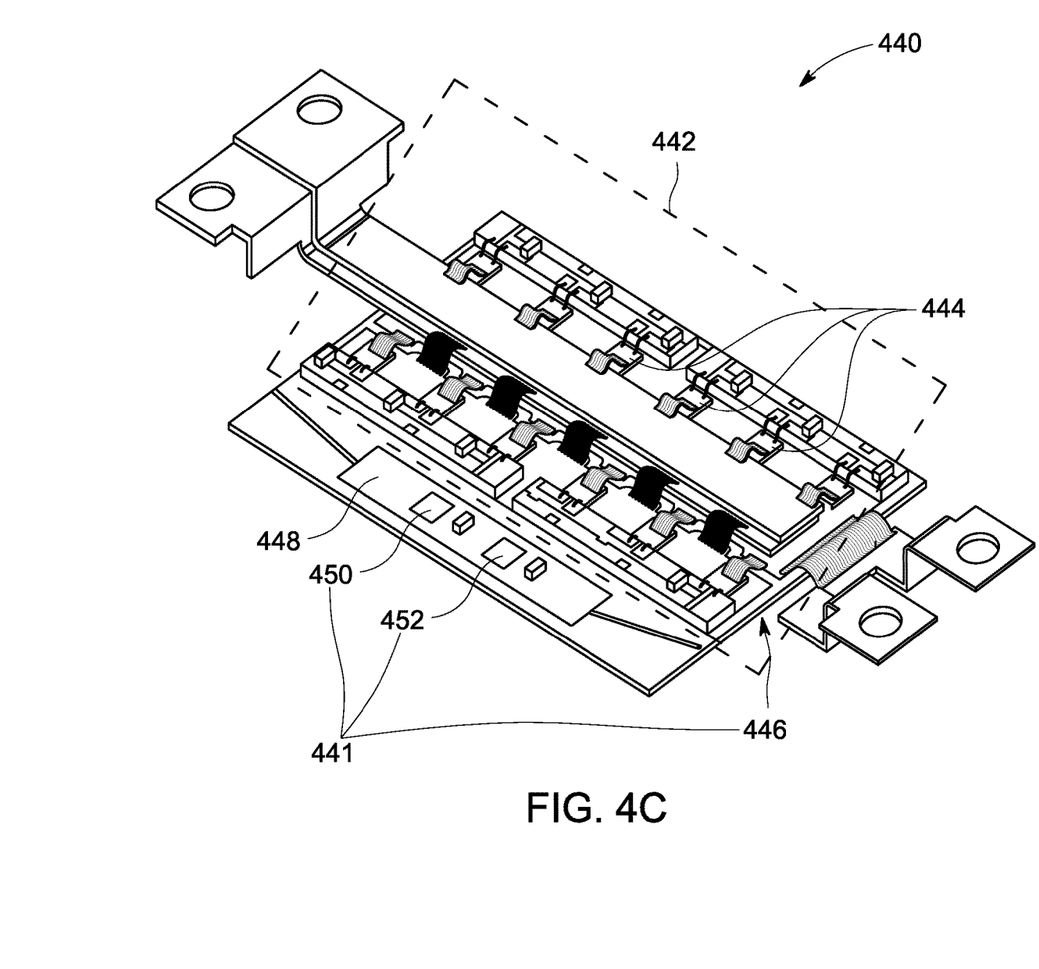
FIG. 4(c) is a diagrammatical representation of a filtering unit in accordance with another embodiment.

FIG. 4(c) is a diagrammatical representation of an active electromagnetic interference filtering system 440 in accordance with another embodiment of the present invention. In particular, FIG. 4(c) shows a filtering unit 441 coupled to a plurality of switching units 442. For ease of illustration, only one switching unit 442 is shown. The filtering unit 441 includes a thermoelectric module 446, an op-amp 450, and a regulator 452. The switching unit 442 includes a plurality of semiconductor switches 444. In one specific embodiment, each semiconductor switch 444 includes a silicon carbide switch or a silicon based switch. In the illustrated embodiment, the plurality of semiconductor switches 444 is disposed on the thermoelectric module 446.

Furthermore, the thermoelectric module 446 is operatively coupled to the op-amp 450 and the regulator 452. The op-amp 450 and the regulator 452 are disposed on a substrate 448 similar to the first substrate 302 of FIG. 3. The op-amp 450 and the regulator 452 are disposed apart from the switching unit 442 to avoid any noise interferences or near field coupling. The filtering unit 441 is configured to filter common mode noise of the switching unit 442. In one embodiment, the active electromagnetic interference filtering system 440 is configured to operate in a normal temperature environment, (for example, room temperature).

As discussed previously with reference to FIG. 2, a single filtering unit 104 is coupled to the AC side 114 and the DC side 112 of the inverter 102. The inverter 102 includes the plurality of switching units 103. With reference to both FIG. 2 and FIG. 4(c), the cumulative effect of common mode noise filtering provided by the filtering unit 441 coupled to each of the switching unit 442 of the inverter 102 is same as the common mode noise filtering provided by the single filtering unit 104. In another embodiment, one filtering unit may be coupled to at least one of the plurality of switching units and another filtering unit may be coupled to first and second sides of the inverter.

Figure 4D:
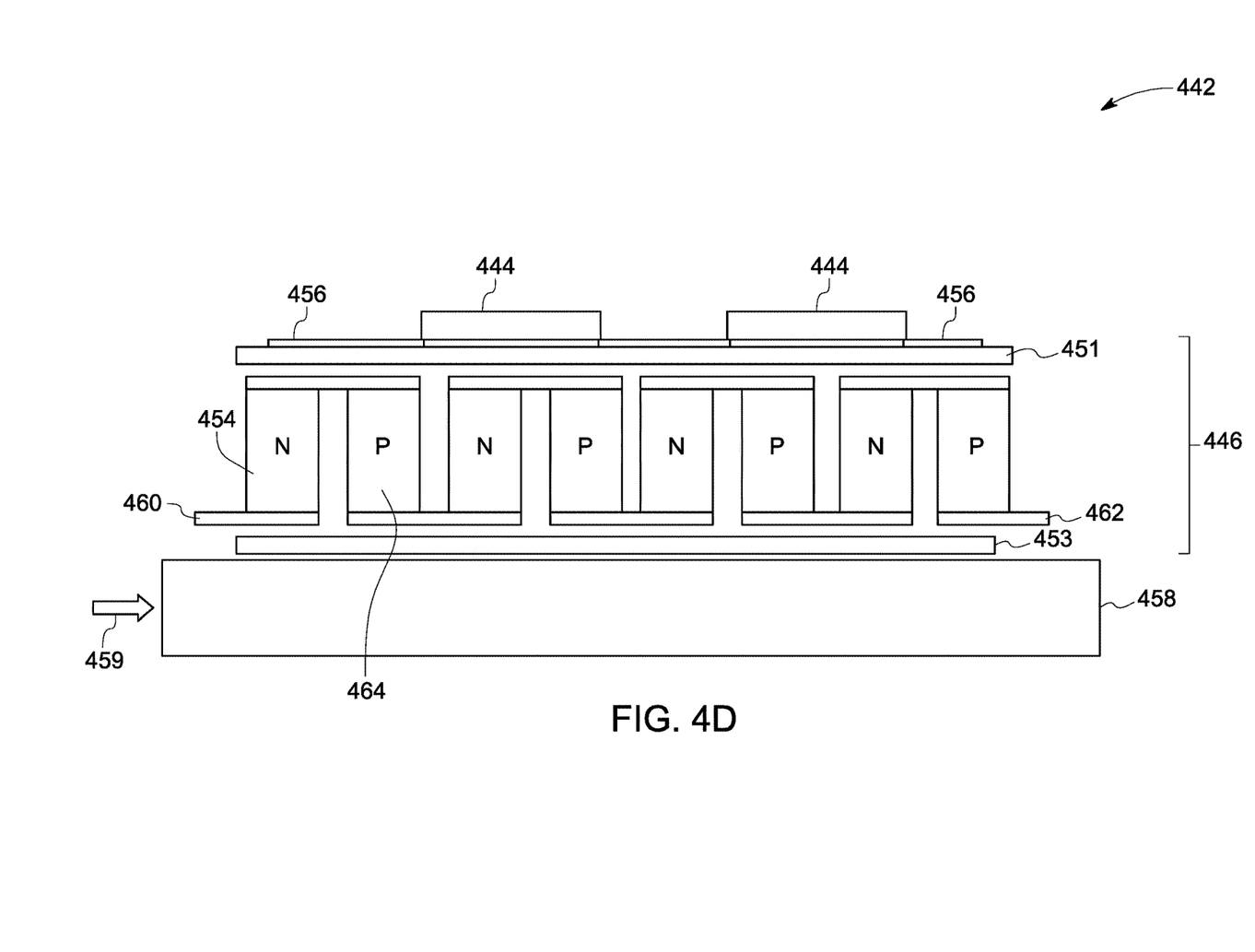
FIG. 4(d) is a diagrammatical representation of the switching unit in accordance with the embodiment of FIG. 4(c)

FIG. 4(d) is a diagrammatical representation of the switching unit 442 in accordance with the embodiment of FIG. 4(c). The switching unit 442 includes the plurality of switches 444.

The thermoelectric module 446 includes a first substrate 451 and a second substrate 453. Furthermore, a conducting layer 456 is disposed on the first substrate 451. The switches 444 are disposed on the conducting layer 456. Further, a plurality of combinations of P-type elements 464 and N-type elements 454 are coupled in series to each other and are disposed between the first substrate 451 and the second substrate 453. Further, the plurality of the combinations of the P-type elements 464 and the N-type elements 454 include the first terminal 460 and the second terminal 462. In one embodiment, the first terminal 460 is a positive terminal and the second terminal 462 is a negative terminal. In the illustrated embodiment, the switching unit 442 includes a cooling device 458 for allowing flow of a coolant 459. The second substrate 453 is disposed on the cooling device 458.

For operating an inverter, the switches 444 are activated and deactivated according to a predetermined pattern. The term 'activation' of the switches 444, as used herein, refers to transitioning the switches to an 'ON' state to form a closed circuit or electrically conducting path. The term 'deactivation' of the switches 444, as used herein, refers to transitioning the switches to an 'OFF' state to form an open circuit or electrically non-conducting path.

When the switches 444 are activated, the switches 444 form a closed conducting path. Although the switches 444 form a closed conducting path, the switches 444 may offer a minimal resistance for flow of current. Power losses are generated across the switches 444 due to current flow through the path that offers resistance. As a result of the power loss generated across the switches 444, heat is generated. Furthermore, heat is generated due to power losses that are generated when the switches 444 are transitioned from an activated state to a deactivated state or vice versa. The heat generation by the switches 444 advantageously generates a hot temperature environment proximate to the first substrate 451. As noted hereinabove, the second substrate 453 is disposed proximate to the cooling device 458. Therefore, a temperature difference is established between the first substrate 451 and the second substrate 453. The thermoelectric module 446 generates a voltage due to the temperature difference. In particular, a voltage is generated across the first terminal 460 and the second terminal 462.

The op-amp 450 and the regulator 452 are coupled across the first terminal 460 and the second terminal 462. Accordingly, the voltage generated by the thermoelectric module 446 is transmitted to the op-amp 450 via a DC link. Thus, the op-amp 450 and the regulator 452 are self-powered. Hence, there is no need for any additional power supply source.

Figure 5A:
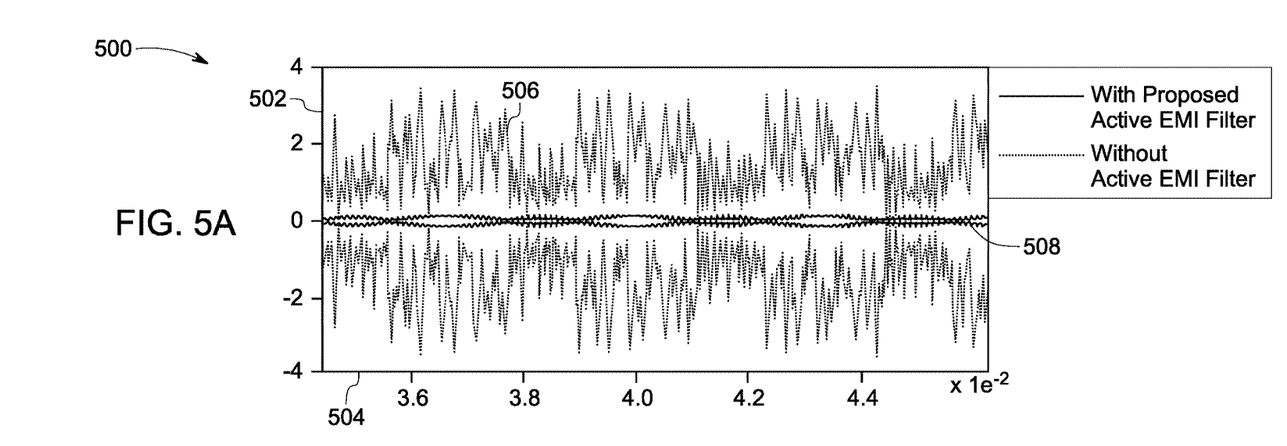
FIGS. 5(a)-5(b) are graphical representations of a common mode noise level in accordance with certain embodiments of the present invention.
Figure 5B:
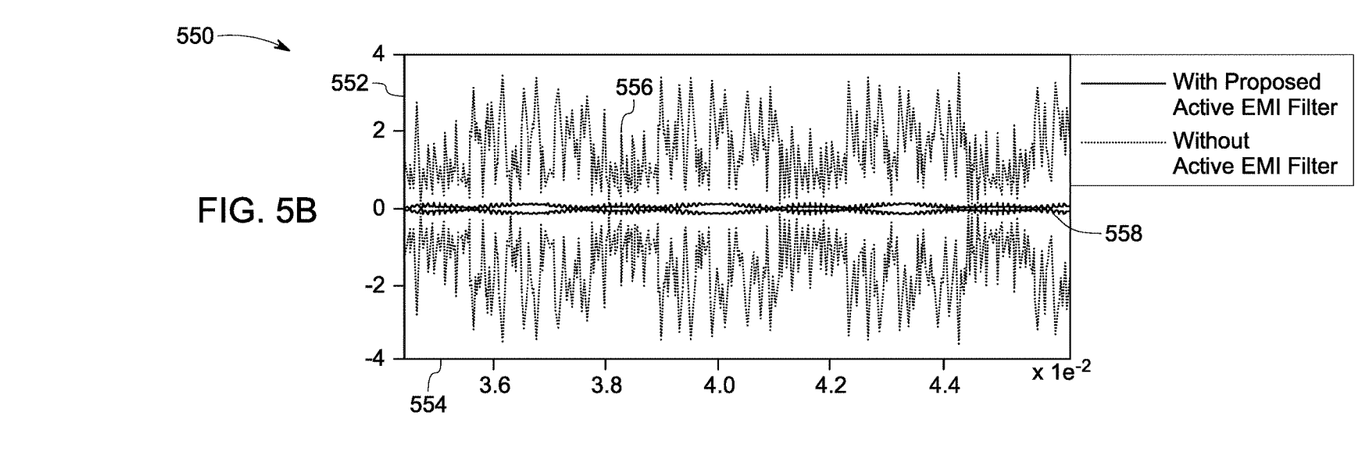

FIGS. 5(*a*)-5(*b*) are graphical representations of common mode noise level corresponding to the system of 100 FIG. 1 in accordance with certain embodiments of the present invention. In particular, FIG. 5(*a*) depicts a simulation result 500 of a common mode noise level of the inverter 102 with and without the filtering unit 104 of FIG. 2. The y-axis 502 represents the amplitude of common mode noise at the DC side 112 in amperes. Further, x-axis 504 represents the time in seconds. Reference numeral 506 represents a profile of the common mode noise at the DC side 112 of the inverter 102 when the filtering unit 104 is not employed. Curve 508 represents the common mode noise at the DC side 112 of the inverter 102, when the filtering unit 104 is employed with the inverter 102. When the filtering unit 104 is employed with the inverter 102, the common mode noise at the DC side 112 is reduced substantially. In one embodiment, the common mode noise at the DC side 112 is reduced by at least ten times when the filtering unit 104 is used.

Further, FIG. 5(*b*) represents a graphical representation 550 of the common mode noise level at the AC side 114 of the inverter 102 of FIG. 1 with and without the filtering unit 104 in accordance with certain embodiments of the invention. The y-axis 552 represents the amplitude of common mode noise at the AC side 114 in amperes. Further, x-axis 554 represents the time in seconds. Reference numeral 556 represents a profile of common mode noise at the AC side 114 of the inverter 102 when the filtering unit 104 is not employed. Curve 558 represents the common mode noise at the AC side 114 of the inverter 102, when the filtering unit 104 is employed with the inverter 102. When the filtering unit 104 is employed with the inverter 102, the common mode noise at the AC side 114 is reduced substantially. In one embodiment, the common mode noise at the AC side 114 is reduced by ten times when the filtering unit 104 is employed. The simulation results of FIGS. 5(*a*)-5(*b*) clearly demonstrate the reduction in the common mode noise level at both the AC side 114 and the DC side 112 of the inverter 102 when the filtering unit 104 is used.

Furthermore, the foregoing examples, demonstrations, and process steps such as those that may be performed by the system may be implemented by suitable code on a processor-based system such as a general-purpose or special-purpose computer. It should also be noted herein that different implementations of the present invention may perform some or all of the steps described herein in different orders or substantially concurrently. Furthermore, the functions may be implemented in a variety of programming languages including but not limited to C++ or Java. Such code may be stored or adapted for storage on one or more tangible, machine readable media such as on data repository chips, local or remote hard disks, optical disks (that is, CDs or DVDs), memory or other media, which may be accessed by a processor-based system to execute the stored code. Note that the tangible media may comprise paper or another suitable medium upon which the instructions are printed. For instance, the instructions may be electronically captured via optical scanning of the paper or other medium, then compiled, interpreted or otherwise processed in a suitable manner if necessary, and then stored in the data repository or memory.

In accordance with the embodiments discussed herein, the exemplary filtering system and method of operating the filtering system facilitates to reduce common mode noise level at both the AC side and the DC side of the inverter. Furthermore, the filtering unit is self-powered and therefore, use of any additional power supply source is not required. In addition, the filtering unit is a floating system, thereby providing efficient common mode noise filtering. Furthermore, the exemplary filtering unit is compact and lightweight.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof.

What is claimed is:

1. A filtering unit comprising:
at least two operational amplifiers, wherein each of the at least two operational amplifiers comprises an input end and an output end, wherein the input end of one operational amplifier is coupled across corresponding input end of another operational amplifier of the at least two operational amplifiers;
a direct current link operatively coupled to the at least two operational amplifiers; and
at least one thermoelectric module, wherein each thermoelectric module comprises a conducting layer,
wherein the direct current link and at least one of the at least two operational amplifiers are operatively coupled to the at least one thermoelectric module, and wherein the filtering unit is configured to be coupled to a DC side and an AC side of an inverter.

2. The filtering unit of claim 1, wherein the at least one thermoelectric module further comprises:
a first substrate;
a second substrate disposed apart from the first substrate; and
a plurality of combinations of P-type elements and N-type elements coupled in series to each other and disposed between the first substrate and the second substrate,
wherein the conducting layer is disposed on the first substrate.

3. The filtering unit of claim 2, wherein each of the first substrate and the second substrate comprise a ceramic plate.

4. The filtering unit of claim 2, wherein the plurality of combinations of the P-type elements and the N-type elements comprises at least two terminals.

5. The filtering unit of claim 4, wherein the at least one thermoelectric module is configured to generate a voltage across the at least two terminals due to a difference in temperature between the first substrate and the second substrate.

6. The filtering unit of claim 5, further comprising a regulator operatively coupled to the at least one thermoelectric module and configured to control the voltage.

7. The filtering unit of claim 6, wherein the direct current link is coupled to the at least two terminals via the regulator.

8. The filtering unit of claim 6, wherein the regulator comprises a silicon-on-insulator regulator.

9. The filtering unit of claim 2, further comprising a cooling device, wherein the second substrate is disposed on the cooling device.

10. The filtering unit of claim 9, wherein the cooling device comprises an aluminum pipe for allowing flow of a coolant.

11. The filtering unit of claim 1, wherein the conducting layer comprises an etched pattern of a plurality of conducting paths.

12. The filtering unit of claim 1, further comprising a current sensing device coupled to the at least two operational amplifiers.

13. A filtering system comprising:
an inverter comprising a first side, a second, side, and a plurality of switching units, wherein the first side is an AC side and the second side is a DC side; and
a filtering unit coupled to the AC side and the DC side of the inverter, the plurality of switching units, or a combination thereof, wherein the filtering unit comprises:
at least two operational amplifiers, wherein each of the at least two operational amplifiers comprises an input end and an output end, wherein the input end of one operational amplifier is coupled across corresponding input end of another operational amplifier of the at least two operational amplifiers;
a direct current link operatively coupled to the at least two operational amplifiers; and
at least one thermoelectric module, wherein each thermoelectric module comprises a conducting layer; wherein the direct current link and at least one of the at least two operational amplifiers are operatively coupled to the at least one thermoelectric module.

14. The filtering system of claim 13, wherein the filtering unit is configured to control a common mode noise level at the AC side and the DC side of the inverter.

15. The filtering system of claim 13, wherein the at least one thermoelectric module further comprises:
a first substrate;
a second substrate disposed apart from the first substrate; and
a plurality of combinations of P-type elements and N-type elements coupled in series to each other and disposed between the first substrate and the second substrate,
wherein the conducting layer is disposed on the first substrate.

16. The filtering system of claim 13, further comprising a plurality of transmission branches, wherein corresponding output end of the at least two operational amplifiers are coupled to the Ac and DC sides of the inverter via the plurality of transmission branches.

17. The filtering system of claim 16, wherein the plurality of transmission branches is configured to transmit an electrical parameter to the AC and DC sides of the inverter, wherein each transmission branch comprises at least one resistor and at least one capacitor coupled in series.

18. The filtering system of claim 13, further comprising a current sensing device coupled to at least one of the AC side and the DC side of the inverter and configured to sense a current transmitted via at least one of the AC side and the DC side of the inverter.

19. The filtering system of claim 13, wherein the filtering unit is configured to control a common mode noise level of at least one of the plurality of switching units.

20. The filtering system of claim 13, wherein the inverter comprises a pulse width modulated inverter.

21. The filtering system of claim 13, where each of the plurality of switching units comprises one or more semiconductor switches.

22. The filtering system of claim 21, wherein the one or more semiconductor switches comprises a silicon carbide switch.

23. The filtering system of claim 21, wherein the one or more semiconductor switches are disposed on the at least one thermoelectric module.

* * * * *